(12) United States Patent
Neel et al.

(10) Patent No.: US 9,897,641 B2
(45) Date of Patent: Feb. 20, 2018

(54) METHOD FOR REAL-TIME MONITORING OF THE OPERATIONAL STATE OF A CAPACITIVE SENSOR

(71) Applicant: FOGALE NANOTECH, Nîmes (FR)

(72) Inventors: Christian Neel, Nîmes (FR); Nicolas Billiard, Nîmes (FR)

(73) Assignee: FOGALE NANOTECH, Nîmes (FR)

( * ) Notice: Subject to any disclaimer, the term of this patent is extended or adjusted under 35 U.S.C. 154(b) by 0 days.

(21) Appl. No.: 15/318,491

(22) PCT Filed: Jun. 10, 2015

(86) PCT No.: PCT/EP2015/062875
§ 371 (c)(1),
(2) Date: Dec. 13, 2016

(87) PCT Pub. No.: WO2015/189232
PCT Pub. Date: Dec. 17, 2015

(65) Prior Publication Data
US 2017/0248649 A1     Aug. 31, 2017

(30) Foreign Application Priority Data

Jun. 13, 2014 (FR) ...................... 14 55403

(51) Int. Cl.
*G01R 31/12* (2006.01)
*G01R 31/02* (2006.01)
(Continued)

(52) U.S. Cl.
CPC ......... *G01R 31/028* (2013.01); *G01R 31/016* (2013.01); *G01R 27/26* (2013.01); *G01R 27/2605* (2013.01)

(58) Field of Classification Search
CPC .. G01R 27/26; G01R 27/2605; G01R 31/028; G01R 31/016; G01D 5/24; G06F 3/044
(Continued)

(56) References Cited

U.S. PATENT DOCUMENTS

| 4,103,225 | A | * | 7/1978 | Stephens | ............ | G01R 27/2605 |
| | | | | | | 324/519 |
| 4,634,964 | A | * | 1/1987 | Chattler | ............... | G01R 31/021 |
| | | | | | | 324/628 |

(Continued)

FOREIGN PATENT DOCUMENTS

| DE | 102007028335 A1 | * | 12/2008 | ............... | G01D 5/24 |
| FR | 2784179 A1 | * | 4/2000 | ............. | F01D 17/02 |

(Continued)

OTHER PUBLICATIONS

French Search Report from French Patent Application No. 1455403, dated Feb. 9, 2015.
(Continued)

*Primary Examiner* — Jermele M Hollington
*Assistant Examiner* — Sean Curtis
(74) *Attorney, Agent, or Firm* — Greer, Burns & Crain, Ltd.

(57) ABSTRACT

A method for real-time monitoring of an operational state of a capacitive sensor capable of being mounted on a rotating machine, and connected to an electronic measuring module via a high frequency transmission line. The method includes generating, within the electronic module, a signal for compensating in capacitance parasitic effects from the transmission line and the sensor, generating, within the electronic module, a signal for compensating in conductance parasitic effects from the transmission line and the sensor, extracting a signal representative of the capacitance compensation and of a signal representative of the conductance compensation (Continued)

so as to determine an operating point of the sensor and analyzing the operating point so as to check if it is located in a predetermined area.

17 Claims, 2 Drawing Sheets

(51) Int. Cl.
    *G01R 31/01*     (2006.01)
    *G01R 27/26*     (2006.01)

(58) Field of Classification Search
    USPC .......................................... 324/548, 658–690
    See application file for complete search history.

(56) References Cited

U.S. PATENT DOCUMENTS

| | | | | |
|---|---|---|---|---|
| 4,896,100 | A * | 1/1990 | Buck | G01D 5/2417 324/679 |
| 7,880,481 | B2 * | 2/2011 | Zangl | G01D 5/24 324/684 |
| 7,944,216 | B2 * | 5/2011 | Brasseur | G01D 5/2405 324/679 |
| 8,576,182 | B2 * | 11/2013 | Hristov | G06F 3/044 178/18.02 |
| 8,933,710 | B2 * | 1/2015 | Blondin | G06F 3/044 324/658 |
| 9,599,452 | B2 * | 3/2017 | Krummel | G01B 7/14 |
| 9,787,358 | B2 * | 10/2017 | Ishikawa | H04B 3/46 |
| 2009/0160461 | A1 * | 6/2009 | Zangl | G01D 5/24 324/684 |
| 2010/0268509 | A1 * | 10/2010 | Zielinski | F01D 11/20 702/158 |
| 2013/0069673 | A1 * | 3/2013 | Virnich | B60N 2/5685 324/686 |
| 2013/0247678 | A1 * | 9/2013 | Manohara | G01L 9/12 73/753 |
| 2015/0048850 | A1 * | 2/2015 | Neel | G06F 3/0418 324/679 |
| 2015/0097582 | A1 * | 4/2015 | Szedlacsek | G01B 7/14 324/662 |
| 2017/0248649 | A1 * | 8/2017 | Neel | G01R 31/028 |

FOREIGN PATENT DOCUMENTS

FR     2912814 A1 *   8/2008  ............ G01D 18/00
JP     2006170797 A *   6/2006

OTHER PUBLICATIONS

International Search Report from International Patent Application No. PCT/EP2015/062875, dated Sep. 24, 2015.
Nritten Opinion from International Patent Application No. PCT/EP2015/062875, dated Sep. 24, 2015.

* cited by examiner

FIG.1 [PRIOR ART]

METHOD FOR REAL-TIME MONITORING OF THE OPERATIONAL STATE OF A CAPACITIVE SENSOR

BACKGROUND

The present invention relates to a method for monitoring the operational state of a capacitive sensor. It can be applied particularly usefully, but not exclusively, in measuring the passes of blades in a rotating machine or a turbomachine such as a turboreactor or an airplane turboprop engine, or an electric generator turbine for example. The invention is broader in scope since it can also apply to any system using a capacitive sensor under very difficult environmental conditions.

During the operation of the turbomachine, it is known to mount a capacitive sensor on the housing. Document US2010268509 describes an electrode constituted by the rotor and a counterelectrode constituted by the housing, in particular the inner layer of the housing particularly constituted by multiple sheets.

In general, it is possible to measure the passes of the blades in a rotating machine or a turbomachine in real time in a non-intrusive manner in order to extract therefrom the clearance between the housing and the tip of the blade as well as the vibrations of the blade. These two items of information, the clearance and the vibrations, are key items of information on the state of health of the blade, i.e. its mechanical integrity. They can be monitored in real time throughout the entire operational period of the machine, in particular via blade health monitoring (BHM).

It is known that capacitive measurements under these conditions are substantially affected by electrical line losses, due to electrical impedance of the transmission line.

Document JP2006170797 is known as describing a principle for compensating the parasitic elements of the transmission line.

Document FR2784179 describes a system for compensating the leakage currents from the transmission line by producing feedback loops from signals representative of the capacitance and conductance compensation.

However, like its environment, motor housing, blade, path, the non-intrusive sensor used to measure the clearance and the vibrations evolves over time as a function of the thermal and mechanical loads which are applied to it during operation.

SUMMARY

A purpose of the present invention is to monitor in real time the state of the sensor.

Another purpose of present invention is to diagnose risks of carrying out unreliable measurements.

At least one of the objectives is achieved with a method for real-time monitoring the operational state of a capacitive sensor capable of being mounted on a rotating machine and connected to an electronic measuring module via a high frequency transmission line.

According to the invention, this method comprises the steps of:
- generating within the electronic module, a signal for compensating in capacitance parasitic effects from the transmission line and the sensor,
- generating within the electronic module, a signal for compensating in conductance parasitic effects from the transmission line and the sensor,
- extracting of a signal representative of the capacitance compensation and of a signal representative of the conductance compensation in order to determine an operating point of the sensor,
- analyzing the operating point so as to verify if it is located in a predetermined area.

According to the implementation methods, the predetermined area can be broader than, or less broad than, or similar to, a normal operating area related to temperature.

The rotating machine can comprise, in particular, a turbomachine such as a turboreactor or an airplane turboprop, or an electrical generator turbine.

With the method according to the invention, real-time monitoring of the state of health of the capacitive sensor is ensured, which can also be completely integrated in a global optimized management of the measuring system.

Advantageously, a so-called active technology is used to the extent that the electronic module implements a conversion of the physical signal into an analogue signal as well as capacitance and conductance compensations for the parasitic effects of the measuring system.

The invention is particularly ingenious mainly, but not only, due to the fact that the compensation signals are used as parameters for monitoring the state of health of the sensor beyond the simple checking of its temperature. In fact such a sensor is surrounded by a very hostile environment related to high temperatures, to the variation in these temperatures, but also to humidity and other pollutants.

While the compensation signals are generally used only for compensation, the present invention takes advantage of their presence in order to work out a policy of monitoring and diagnostics. In order to do this, the space occupied by the capacitance and conductance compensation values, i.e. a two-dimensional space having the capacitance and conductance values on the x-axis and the y-axis, or vice versa, is considered. A tolerance area, referred to as predetermined area, in which the sensor is operational, is then determined. Outside this predetermined area, the sensor is considered as defective for various reasons. An operating point is a point in the space of the compensation values. It is known that the operating point evolves as a function of the temperature. It is provided that the predetermined area is preferably strictly broader than the evolution curve as a function of the temperature. This means that other elements of failure are taken into account in addition to the temperature.

According to an advantageous characteristic of the invention, the method can also comprise a step of triggering an alarm signal when the operating point is outside the predetermined area. It can be an all-or-nothing checking that makes it possible to warn an operator that the current operating point has been achieved with a non-operational sensor.

Advantageously, the method according to the invention can comprise a step of analyzing the evolution of the operating point so as to derive a diagnosis therefrom. This evolution can be concretized by a trajectory and/or a speed and/or an acceleration.

With the present invention, the operating point is analyzed. But its evolution over time is also analyzed so as to derive therefrom a certain number of teachings such as for example the type of fault or risk as will be seen below. By monitoring the evolution of the compensations over time, it is possible to diagnose the state of health of the sensor during its use. In the case of the capacitive measurement, this can be done by monitoring the evolution of the conductance and capacitance compensation.

According to an advantageous embodiment of the invention, the predetermined area is defined from limit values of the temperature of the sensor and/or of the transmission line, and from limit values of capacitance and conductance representative of at least one of the following values: short-circuit of electrodes of the sensor, breaking or short-circuit of the connection between the electronic module and the sensor, cracking of a ceramic contained in the sensor.

Thus the predetermined area is carried out on the basis of numerous parameters obtained by experiment or by calculation from the parasitic resistances and capacitances of the measuring system. There parameters are directly related to the sensor.

In particular, in addition to the above, the predetermined area can also be defined on the basis of limit values of capacitance and conductance representative of at least one of the following parameters of the transmission line: breaking of the means of connection to the ground, breaking of the means of connection to a guard. There parameters are directly related to the transmission line. Failures due to the transmission line or to the sensor, and which type of failure, can thus be diagnosed.

By way of a non-limitative example, several parameters and their influence in determining the predetermined area may be mentioned.

For example, a risk factor related to the short-circuit of the electrodes of the sensor when the operating point tends towards saturation conductance and capacitance values is determined. It is therefore relatively simple to deduce a risk of evolution towards a short-circuit fault by analyzing the fact that the operating point is evoluting towards maximum capacitance and conductance values.

It is also possible to determine a risk factor related to a ceramic cracking in the sensor when the operating point evolves towards higher and higher conductance and capacitance values. A strong variation in the conductance value independently of the variation in the capacitance value can thus presage of an embrittlement of the ceramic constituting the sensor.

It is also possible to determine a risk factor related to a high temperature of the sensor when the operating point evolves towards higher and higher conductance and capacitance values.

It is also possible to determine a risk factor related to a high temperature of the transmission line when the operating point evolves towards negative conductance and capacitance values that are higher and higher in absolute value, and higher and higher positive capacitance values.

It is finally possible to determine for example a risk factor related to a break in the means of connection of the transmission line to ground when the operating point evolves towards lower and lower conductance and capacitance values.

The means of connection to the ground can quite simply be connectors connected to ground.

It is also possible to determine a risk factor related to a break in the means of connection of the transmission line to a guard when the operating point evolves towards higher and higher capacitance values.

According to an advantageous embodiment of the invention, each measurement carried out by the capacitive sensor can be accompanied by determination of said operating point; the measurement being validated only when the operating point is inside the predetermined area. It is a monitoring process which can be automatic, so that only the measurements carried out under good conditions are taken into account.

Preferably, a step of emitting a sound and/or visual signal when the operating point is outside the predetermined area is provided.

The invention also provides the use of the method as described below, for measuring the time of passage of the blade tips in a rotating machine.

A capacitive measuring system is also provided, comprising:
    a capacitive sensor capable of being mounted on a rotating machine,
    an electronic measuring module, and
    a high-frequency transmission line linking the sensor to the electronic module.

According to the invention, the electronic module is configured in order to carry out real-time monitoring of the operational state of the sensor by the steps of:
    generating a signal for compensating in capacitance parasitic effects from the transmission line and the sensor,
    generating a signal for compensating in conductance parasitic effects from the transmission line and the sensor,
    extracting a signal representative of the capacitance compensation and of a signal representative of the conductance compensation so as to determine an operating point of the sensor,
    analyzing the operating point in order to check if it is outside a predetermined area.

According to an advantageous characteristic of the invention, the transmission line can comprise a triaxial or coaxial cable.

According to an advantageous characteristic of the invention, the capacitive measuring system can comprise a capacitive sensor of the triaxial or coaxial type.

BRIEF DESCRIPTION OF THE DRAWINGS

Other advantages and characteristics will become apparent on examination of the detailed description of an embodiment which is in no way limitative, and the attached drawings, in which.

DETAILED DESCRIPTION

Although the invention is not limited thereto, a measuring system will now be described, comprising a capacitive sensor mounted on a housing of a turbomachine for measuring the time of passage of the blade tips. Aerodynamic, thermal and mechanical loads on the turbomachine when operating can alter the reliability of the sensor, thus distort the measurements. In the context of a general monitoring of the state of the blades, it is necessary to also take into account the evolution of the state of the sensor.

The implementation of the invention will be described in relation to an embodiment of a capacitive detection system implementing automatic compensation of the leakage capacitances and conductances as described in the document FR2784179.

Of course the invention can be implemented with other embodiments of a capacitive detection system implementing a compensation of the leakage capacitances and conductances.

For reasons of clarity and conciseness, FIG. 1 and the description relating thereto below are essentially taken from this document FR2784179.

Figure 1:
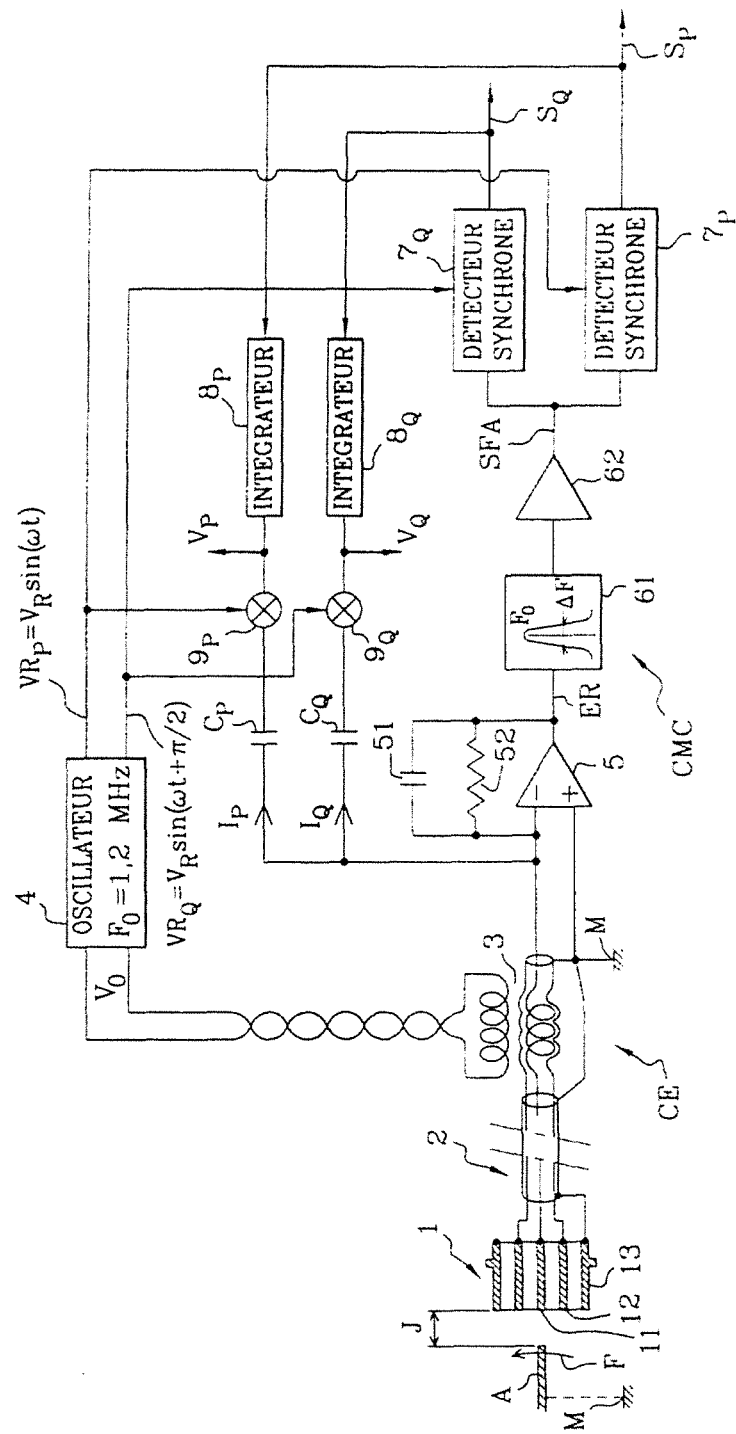
FIG. 1 is a diagrammatic view of an example of an active measuring system adapted for the implementation of the invention.

With reference to FIG. 1, the capacitive measuring system comprises an input circuit CE and a capacitive measuring circuit CMC.

The input circuit CE essentially comprises a capacitive sensor 1, a connecting high-frequency transmission line 2 and a transformer 3 connected to a high-frequency voltage source 4.

In the embodiment presented, the capacitive sensor 1 is of the triaxial type and comprises first, second and third concentric electrodes 11, 12 and 13.

The first electrode is a central measuring electrode 11, of the order of a few millimeters in diameter, for example. The electrode 11 has a free end which is arranged facing a part A connected to a reference potential such as the ground M of a device including the part A, directly or by parasitic capacitances specific to the device. The distance J between the end of the measuring electrode 11 and the part A is to be measured. For example, the part A is successively constituted by the blades of a turbine rotating about a shaft perpendicular to the plane of FIG. 1, following the arrow F. The distance J is the variable clearance, of the order of a millimeter, between the ends of the blades A passing successively in front of the central electrode 11.

The variation in the clearance J generates a low-frequency signal whose amplitude variations vary little from one cycle to the next, each cycle corresponding to the passage of a respective blade. The low-frequency signal modulates in amplitude a carrier of frequency $F_0$ into a modulated signal having an amplitude varying as a function of the clearance J. The second electrode 12 surrounds the first electrode 11 and constitutes a guard electrode.

The third electrode 13 is a shielding electrode connected to ground M and surrounding the electrode 12 and constitutes the cylindrical metallic body of the sensor 1. The front face of the body of the sensor is fixed in a hole in the, for example, cylindrical or conical revolution housing CT of the turbine.

The parasitic impedance values, both at the sensor 1 and at the connecting line 2 are variable with the temperature and the measuring system 1 must be very tolerant for these variations in capacitance and resistance.

The connecting line 2, according to the embodiment shown in FIG. 1, comprises a section of triaxial cable with three concentric conductors 21, 22 and 23 respectively connected to the electrodes 11, 12 and 13 of the sensor 1. In general, the connecting cable comprises a rigid triaxial cable LTR typically a few meters in length, one end of which is soldered directly to the sensor, and a flexible triaxial cable LTS, the length of which can be from a few meters to a few tens of meters. The connecting cable can also comprise a section of coaxial cable on the electronics side.

According to other embodiments, the capacitive sensor 1 can be of the coaxial type. In this case it comprises only one first measuring electrode 11 and one third shielding electrode 13 connected to ground M.

In this case the connecting line 2 is a coaxial cable which comprises two concentric conductors 21 and 23 respectively connected to the electrodes 11 and 13 of the coaxial sensor 1.

An important difference between the coaxial and triaxial sensors is that the loss impedances in the coaxial sensors are more highly dependent on the temperature. Depending on the applications, it can be useful to minimize this dependency, or on the contrary, to deliberately increase it.

The alternative voltage source 4 is a high-frequency HF oscillator, controlled by a quartz at a carrier frequency $F_0$, and controlled in amplitude so as to improve the waveform of the generated carrier and to guarantee the constancy of the characteristics of the measuring system. The carrier, which is a sinusoidal polarization voltage, is applied by the oscillator 4 to the sensor 1 via the transformer 3.

In the embodiment presented, this carrier typically has an amplitude of the order of from a few volts to 10 volts RMS, and a frequency $F_0$ of the order of MHz.

The oscillator also provides two reference voltages in phase and in quadrature.

$$VR_P=V_R \sin(\omega t) et\ VR_Q=V_R \sin(\omega t+\pi/2)$$

with $\omega=2\pi F_0$ the pulsation of the HF carrier. The voltages $VR_P$ and $VR_Q$ are used to control synchronous detectors and generate active compensation voltage signals that are necessary to the operation of the capacitive measuring circuit CMC.

In the input circuit CE, the transformer 3 has a primary connected to output terminals of the oscillator 4 producing the carrier $V_0 \sin(\omega t)$ of frequency $F_0$ and a secondary, constituting a floating source, connected on the one hand to the sensor 1 via the connecting line 2 and on the other hand to the inputs of a charge amplifier 5 included in the measuring circuit CMC. As will be seen below, the connecting line can be of the shielded triaxial or two-wire type, or coaxial type; a conductor of the connecting line connects the measuring electrode 11 to the inverting input (−) of the amplifier 5 via the secondary of the transformer 3. A shield conductor of the connecting line connects at least the shielding electrode 13 of the sensor 1 to the ground terminal M.

The charge amplifier 5 is an operational amplifier 30, the output of which is connected in feedback to the inverting input (−) via a feedback capacitor 51 of capacitance C51 and a feedback resistor 52 in parallel, and via a control loop described below.

The control loop comprises a bandpass filter 61 and an amplifier 62 connected in cascade to the output of the charge amplifier 5, as well as two parallel paths between the output of the amplifier 62 and the inverting input (−) of the charge amplifier 5. The channels are assigned to the phase (P) and quadrature (Q) signal processings. Each path comprises in cascade a synchronous detector $7_P$, $7_Q$, an integrator $8_P$, $8_Q$, a multiplier $9_P$, $9_Q$ et a reference capacitor $C_P$, $C_Q$ of reference capacitance $C_R$.

The path comprising the synchronous detector $7_P$, the integrator $8_P$, the multiplier $9_P$ and the reference capacitor $C_P$ makes it possible to compensate the reactive part of the loss impedance of the sensor 1 and of the connecting line 2.

The path comprising the synchronous detector $7_Q$, the integrator $8_Q$, the multiplier $9_Q$ and the reference capacitor $C_P$ makes it possible to compensate the resistive part of the loss impedance of the sensor 1 and of the connecting line 2.

This loss impedance can be globally modelled as a parasitic capacitance and resistance in parallel between the inverting input (−) of the charge amplifier 5 and the ground M.

The AF bandwidth of the filter 61 is centred on the frequency $F_0$ of the oscillator 4 and a width typically fixed at approximately 300 kHz. The amplifier 62 is a unity-gain follower-amplifier and produces a filtered and amplified voltage signal SFA the amplitude of which varies inversely with the clearance J in the sensor 1. This signal is applied to the two synchronous detectors $7_P$ and $7_Q$ which are controlled by the reference phase and quadrature voltages $VR_P$ and $VR_Q$ provided by the oscillator 4. The synchronous detectors $7_P$ and $7_Q$ are phase detectors which amplitude demodulate the filtered and amplified voltage signal SFA into two phase and quadrature component signals $S_P$ and $S_Q$ one of which, $S_P$, is used to measure the clearance J. The low-frequency component signals $S_P$ and $S_Q$ are respectively integrated in the integrators $8_P$ and $8_Q$ into a phase voltage $V_P$ and a quadrature voltage $V_Q$ in order to stabilize the control loop. The voltages $V_P$ and $V_Q$ leaving the integrators are applied to first inputs of the two multipliers $9_P$ and $9_Q$ with a multiplication factor K so as to multiply the voltages $V_P$ and $V_Q$ respectively by the reference voltages $VR_P=V_R \sin(2\omega t)$ and $VR_Q=V_R \sin(2\omega t+\pi/2)$ applied to second inputs of the multipliers.

The amplitude modulated signals $[K V_P V_R \sin(2\omega t)]$ and $[K V_Q V_R \sin(2\omega t+\pi/2)]$ produced by the multipliers $9_P$ et $9_Q$ are reinjected at the inverting input (−) of the charge amplifier 5 via the reference capacitors $C_P$ and $C_Q$ with suitable phases and added to the measuring signal transmitted by the sensor 1 via the transformer 3 in order to obtain the stability of the control.

Given the amplification factor ensured by the integrators which is very high at the low frequencies, the average value of the error signal ER leaving the amplifier 5 and thus the average values of the $S_P$ et $S_Q$ signals are maintained at zero.

The in-phase current passing through the sensor 1 and having $(V_0 C_{13}\omega)$ as amplitude is compensated by the current passing through the phase capacitor Cp, having the amplitude:

$$I_P = K\, V_P\, V_R C_R \omega.$$

The quadrature current due to the sensor losses and having $(V_0 C_{13})$ as amplitude is compensated by a current passing through the quadrature capacitor CQ, having the amplitude:

$$I_Q = K\, V_Q V_R C_R \omega.$$

The capacitor $C_Q$ supplied with the quadrature current behaves as a resistor supplied with an in-phase current. It thus allows for a compensation of the resistive losses, while avoiding the thermal noise which would be introduced by the use of a resistor.

The nominal sensitivities at the outputs of the integrators $I_P$ and $I_Q$ are:

$$S(V_P) = \frac{V_P}{C_{13}} = \frac{V_0}{KV_R}\frac{1}{C_R}\text{V/pF, and}$$

$$S(V_Q) = \frac{V_Q}{1/R_{13}} = \frac{V_0}{KV_R}\frac{1}{C_R\omega}\text{V/Siemens.}$$

At the output of the amplifier 5, the error signal ER is normally zero when the part A is immobile. In operation, when the turbine rotates, the signal ER comprises only the background noise of the capacitive sensor 1, as well as transient signals, for example the passage of a blade A, which are in the limited bandwidth AF of the control.

The signal $S_P$ (or $S_Q$) of passage of a blade is present at the output of the clearance measuring system in the form of a signal with a zero average value.

Figure 2:
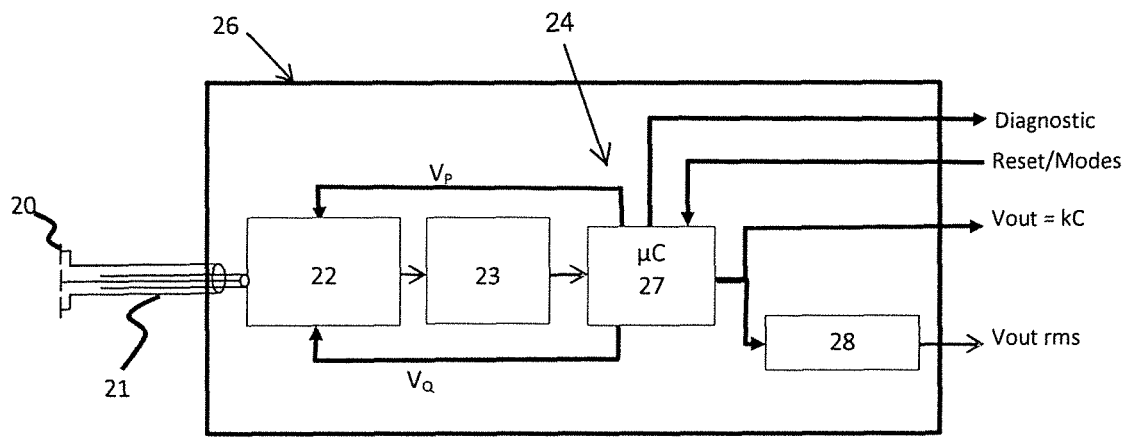
FIG. 2 is a simplified diagrammatic view of the incorporation of the diagnostic method according to the invention in an active measuring system.

The simplified diagram of FIG. 2 is a functional representation of a measuring and processing system implementing the method according to the invention. In the presented embodiment, it comprises an electronic module 26 incorporating the electronic elements of FIG. 1. According to the invention, the electronic module 26 also comprises a signal processing unit 24 capable of implementing the method according to the invention.

The sensor 20 is arranged at the end of a transmission line 21 constituted by a triaxial cable. In the presented embodiment, the sensor 20 is a coaxial sensor, the electrodes of which are connected respectively to the measuring conductor and the ground conductor of the cable. Other cables can of course be used, such as in particular a coaxial cable.

The input of the electronic module 26 is ensured by the preamplifier 22 comprising in particular the charge amplifier 5 of FIG. 1. Conductance and capacitance compensation signals are generated by the signal processing unit 24 and are injected into the preamplifier 22. An amplifier 23, incorporating in particular the amplifier 62 of FIG. 1, supplies, after amplification, the signal processing unit 24 from a signal coming from the preamplifier 22. The processing unit 24 advantageously comprises the synchronous detectors and the integrators of FIG. 1 as well as a microcontroller 27 configured in order to implement the method according to the invention. This microcontroller 27 receives the signals VQ and VP, then derives therefrom conductance and capacitance values, knowing that VQ is proportional to the conductance which can be named $G_L$, and VP is proportional to the capacitance which can be named $C_L$.

The signal processing unit 24 is capable of generating an output signal Vout which is proportional to the capacitance measured by the sensor 20, Vout=kC, k being a real number. This output signal can supply a RMS/DC converter 28.

The microcontroller is configured in order to determine in real time the values of $G_L$ and $C_L$ and store these values in memory so as to monitor their evolutions. A value $G_L$ associated with a value $C_L$ constitutes an operating point which can be represented in a two-dimensional space having the values of $C_L$ for the x-axis and the values of $G_L$ for the y-axis.

Figure 3:
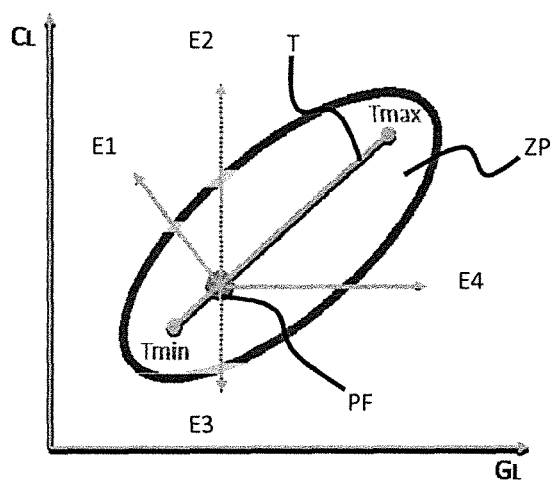
FIG. 3 is a curve showing the predetermined area for a coaxial sensor.

FIG. 3 shows curves representing the variations in the operating point in a $G_L/C_L$ coordinate system for a coaxial sensor.

There can be seen a first curve T in the form of an oblique segment in the domain of the positive conductance and capacitance values.

In a so-called normal state of health, as a function of the variation in environmental parameters such as temperature, the line compensation, represented by the capacitance $C_L$ and the conductance $G_L$, remains in or close to the predetermined curve T and the capacitance $C_L$ and the conductance $G_L$ follow a monotone evolution with respect to each other (for example the conductance increases when the capacitance increases).

In the case of a failure of the sensor or of the cable, the operating point materialized by the capacitance $C_L$ and the conductance $G_L$ moves away from the so-called normal operating curve T. Detection of the evolution of these parameters at a distance from the normal operating curve makes it possible to detect failures and/or to invalidate measurements, in the context for example of a blade state monitoring (BHM for "blade health monitoring").

Under normal conditions, the current operating point PF can develop over the curve T between a lower point corresponding to a temperature Tmin and an upper point corresponding to a temperature Tmax.

According to the invention, in order to detect the failures and the risks, a curve defining a predetermined area ZP can be defined beforehand. This predetermined area includes the curve T. It is thus possible to implement the following method of detection:

when the operating point is no longer on the curve T but is inside the predetermined area, it is considered that there is a risk to the operating state of the sensor and that it is necessary to monitor the evolution;

Beyond the predetermined area, it is considered that the measurement is not reliable.

FIG. 3 shows arrows E1-E4 which start from the operating point and point in different directions. Each arrow represents a risky evolution due to one or more predefined characteristics.

For example, the evolution in the direction of the arrow E1 (the capacitance increases when the conductance decreases) is characteristic of a evolution towards a break in the transmission line.

The evolution in the direction of the arrow E2 (increase in the capacitance for a fixed value of the conductance) is characteristic of a evolution towards a break in a guard connection of the transmission line.

The evolution in the direction of the arrow E3 (reduction in the capacitance for a fixed value of the conductance) is characteristic of a evolution towards a break in the electrode of the sensor.

The evolution in the direction of the arrow E4 (increase in the conductance for a fixed value of the capacitance) is characteristic of a evolution towards a short-circuit at the sensor or the transmission line.

Figure 4:
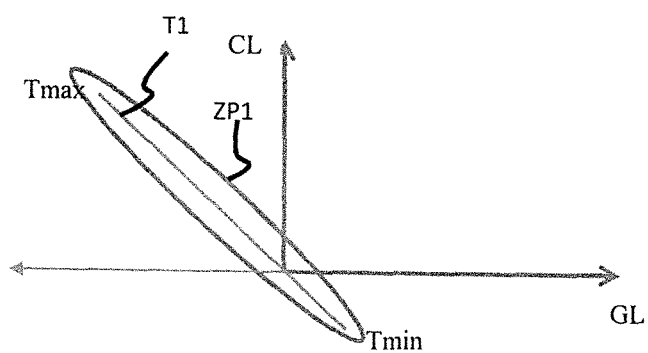
FIG. 4 is a curve showing the predetermined area for a triaxial sensor.

FIG. 4 shows a normal operating curve T1 in a predetermined area ZP1 for a triaxial sensor. In this case, the curve T1 is a curve passing through zero and having a minimum (corresponding to a temperature value Tmin) in the quadrant of the positive conductances and of the negative capacitances. The maximum (corresponding to a temperature value Tmax) is located in the quadrant of the negative conductances and of the positive capacitances.

As explained previously, the present invention makes it possible to carry out various diagnoses from the analysis of the operating point and of its evolution. Different scenarios are described below simply by way of non-limitative examples.

Concerning the capacitive sensor:
a cracking in the ceramic constituting the insulator between the electrodes can result in an absorption of humidity or pollutants. It is characterized by abnormally high leakage conductance values $G_L$. The associated risks are oxidation, definitive pollution, breakage and thus destruction of the sensor;

a too high temperature causes an increase in the dielectric permittivity of the insulator. It is characterized by abnormally high leakage capacitance $C_L$ and leakage conductance $G_L$ values. The associated risks are irreversible damage to or destruction of the sensor;

a short-circuit trigger between the measuring electrode and the ground is characterized by saturations of the compensation voltages and overconsumption of the oscillator 4 which excites the transformer. There is also a risk of destruction of the sensor;

a break in the electrical connection to the measuring electrode, apart from the absence of measurement signals, is characterized by a reduction in the leakage capacitance $C_L$ due to the fact that the residual leakage capacitance relates only to the section of the measuring line up to the break.

Concerning the cable, and in particular a triaxial cable:
a too high temperature causes an increase in the dielectric permittivity of the insulator (generally mineral). It is characterized by abnormally high leakage capacitance $C_L$ and leakage conductance $G_L$ values in absolute value, the leakage conductance $G_L$ (equivalent) having a negative sign because of the dephasing introduced by the resistance of the guard cable;

a break in the connection of the ground conductors is characterized by abnormally low leakage capacitance $C_L$ and leakage conductance $G_L$ values since they correspond to a length of cable (up to the break) less than the normal length.

a break in the connection of the guard conductors is characterized by abnormally high leakage capacitance $C_L$ since they correspond to increased leakage capacitance towards the ground.

Thus, it can be noted that the invention makes it possible to diagnose causes of failure, or groups of causes of failures, or an abnormal state, by detecting at least one of the following events:

an abnormal evolution of a parameter among the leakage capacitance $C_L$ and leakage conductance $G_L$, the other parameter retaining a normal value;—an abnormal evolution of the two parameters, the leakage capacitance $C_L$ and leakage conductance $G_L$.

Of course, the range of possible failures or a more precise identification of the failure can be realized according to the invention by incorporating additional information into the analysis, such as:

external temperature measurements;

the quality of the measurements, or the absence of measurements;

a monitoring of electricity consumption, in order to detect in particular saturated components.

Of course, the invention is not limited to the examples which have just been described and numerous adjustments can be made to these examples without exceeding the scope of the invention.

The invention claimed is:

1. A method for real-time monitoring of an operational state of a capacitive sensor capable of being mounted on a rotating machine, and connected to an electronic measuring module via a high frequency transmission line, the method comprising the steps of:

generating, within the electronic module, a signal for compensating in capacitance parasitic effects from the transmission line and the sensor;

generating, within the electronic module, a signal for compensating in conductance parasitic effects from the transmission line and the sensor;

extracting the signal representative of the capacitance compensation and the signal representative of the conductance compensation and associating the extracted signals so as to determine an operating point of the sensor and of the transmission line; and analyzing the operating point so as to check if it is located in a predetermined area.

2. The method according to claim 1, further comprising a step of triggering an alarm signal when the operating point is outside the predetermined area.

3. The method according to claim 1, further comprising a step of analyzing the evolution of the operating point so as to deduce a diagnosis therefrom.

4. The method according to claim 1, wherein the predetermined area is defined on the basis of temperature limit values of the sensor and/or of the transmission line and from capacitance and conductance limit values representative of at least one of the following parameters: short-circuit of electrodes of the sensor, breaking or short-circuit of the connection between the electronic module and the sensor, cracking of a ceramic contained in the sensor.

5. The method according to claim 4, wherein the predetermined area is further defined on the basis of capacitance and conductance limit values representative of at least one of the following parameters of the transmission line: breaking of the means of connection to the ground, breaking of the means of connection to a guard.

6. The method according to claim 4, further comprising a step of determining a risk factor related to short-circuit of the electrodes of the sensor when the operating point tends towards saturation conductance and capacitance values.

7. The method according to claim 4, further comprising a step of determining a risk factor related to a ceramic cracking of the sensor when the operating point evolves towards higher and higher conductance values.

8. The method according to claim 4, further comprising a step of determining a risk factor related to a high temperature of the sensor when the operating point evolves towards higher and higher conductance and capacitance values.

9. The method according to claim 5, further comprising a step of determining a risk factor related to a high temperature of the transmission line when the operating point evolves towards higher and higher conductance values in absolute value, and towards higher and higher positive capacitance values.

10. The method according to claim 5, further comprising a step of determining a risk factor related to a break in means of connection to the ground of the transmission line when the operating point evolves towards lower and lower conductance and capacitance values.

11. The method according to claim 5, further comprising a step of determining a risk factor related to a break in means of connection to a guard of the transmission line when the operating point evolves towards higher and higher capacitance values.

12. The method according to claim 1, wherein each measurement carried out by the capacitive sensor is accompanied by determination of said operating point, the measurement being validated only when the operating point is inside the predetermined area.

13. The method according to claim 1, further comprising a step of transmitting a sound and/or visual signal when the operating point is outside the predetermined area.

14. A use of the method according to claim 1, for measuring the time taken for the tips of blades to pass in a rotating machine.

15. A capacitive measuring system comprising:
a capacitive sensor capable of being mounted on a rotating machine;
an electronic measuring module; and
a high-frequency transmission line connecting the sensor to the electronic module, wherein the electronic module is configured to carry out real time monitoring of an operational state of the sensor by the steps of:
generating a signal for compensating in capacitance parasitic effects from the transmission line and the sensor;
generating a signal for compensating in conductance parasitic effects from the transmission line and the sensor;
extracting the signal representative of the capacitance compensation and the signal representative of the conductance compensation and associating the extracted signals so as to determine an operating point of the sensor and of the transmission line; and
analyzing the operating point to check if it is outside a predetermined area.

16. The capacitive measuring system according to claim 15, characterized in that the transmission line comprises a triaxial or coaxial cable.

17. The capacitive measuring system according to claim 15, characterized in that it comprises a capacitive sensor of the triaxial or coaxial type.

\* \* \* \* \*